United States Patent [19]

Sawaoka et al.

[11] Patent Number: 4,985,401
[45] Date of Patent: Jan. 15, 1991

[54] METHOD FOR PRODUCING A SUPERCONDUCTOR OF AN IMMISCIBLE ALLOY AND ITS OXIDE

[75] Inventors: Akira Sawaoka, Kanagawa; Ryuichi Matsuda, Tokyo; Tadashi Kondo, Aichi, all of Japan

[73] Assignee: Aisin Seiki Kabushiki Kaisha, Kariya, Japan

[21] Appl. No.: 315,162

[22] Filed: Feb. 24, 1989

[30] Foreign Application Priority Data

Feb. 25, 1988 [JP] Japan .................................. 63-40665

[51] Int. Cl.$^5$ ............................................ H01B 12/00
[52] U.S. Cl. ......................................... 505/1; 505/805; 505/809; 505/815; 505/823; 419/48; 75/234; 75/235
[58] Field of Search .................... 505/805, 1, 809, 815, 505/823; 419/48; 75/234, 235

[56] References Cited

U.S. PATENT DOCUMENTS 3,752,665  9/1973  Roy et al. ............................. 75/135
4,826,808  5/1989  Yurek et al. ........................... 505/1

OTHER PUBLICATIONS

Japanese Journal of Applied Physics, "Preparation of a High $I_c$ Superconductor by Oxidation of an Amorphous La Sr Cu Alloy Ribbon in Air", vol. 26, No. 4, 1987.

*Primary Examiner*—Stephen J. Lechert, Jr.
*Assistant Examiner*—Nina Bhat
*Attorney, Agent, or Firm*—Burns, Doane, Swecker & Mathis

[57] ABSTRACT

A superconductor is produced by electric discharge explosion flame spraying of a composite body of constituents of an immiscible alloy. The electrically discharged composite body is deposited on a substrate and the resultant alloy is oxidized to yield an oxide of the alloy having superconductive property. This process can be applied to the Ln-Ba-Cu system (Ln is at least one of the rare earth elements including Y), typically the $Y_1Ba_2Cu_3$- or $Y_2Ba_4Cu_8$ system, or other immiscible alloy systems such as the Bi-(Ca, Sr)-Cu system to form an oxide thereof.

19 Claims, 2 Drawing Sheets

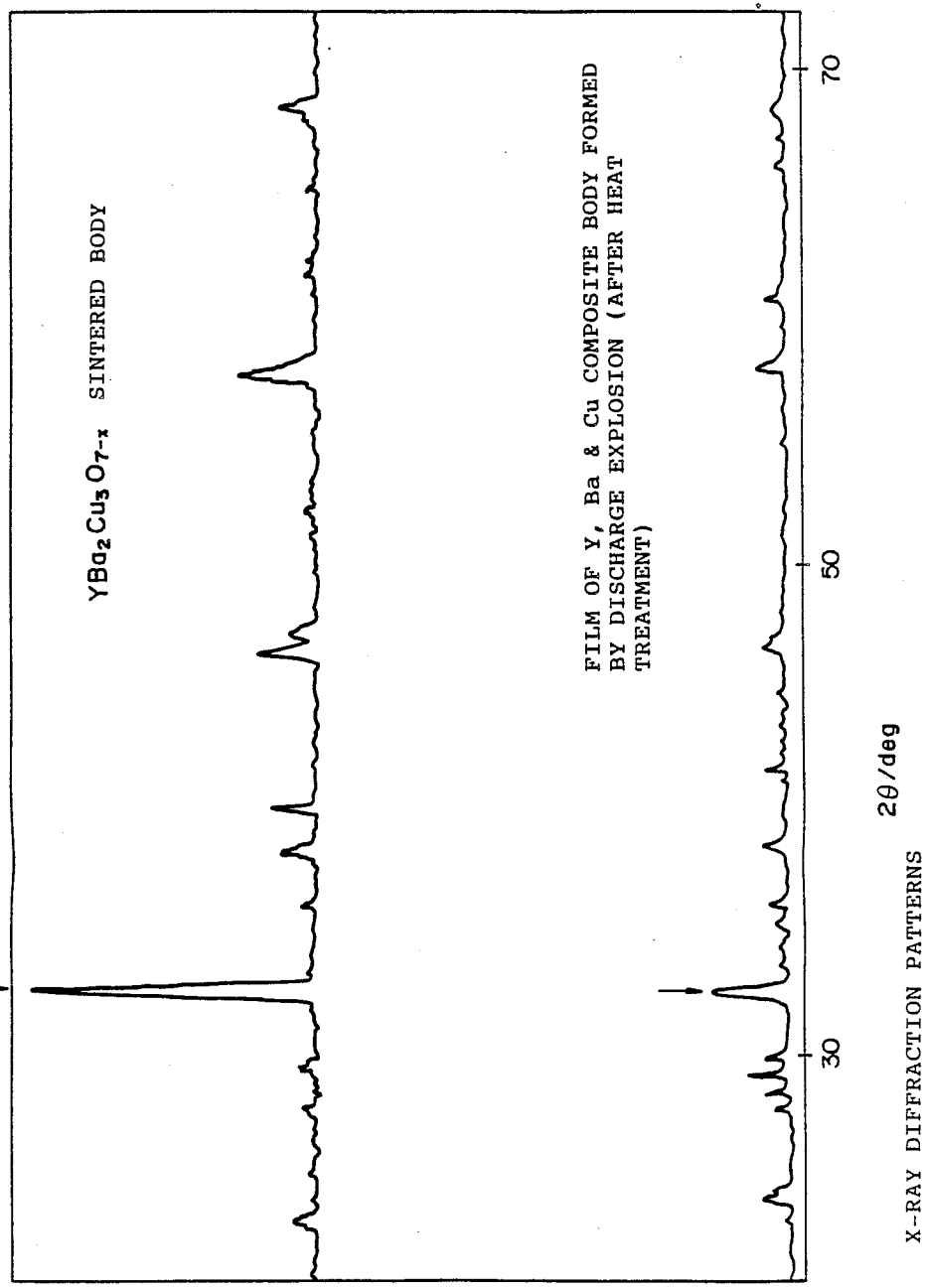

METHOD FOR PRODUCING A SUPERCONDUCTOR OF AN IMMISCIBLE ALLOY AND ITS OXIDE

BACKGROUND OF THE INVENTION

This invention relates to a method for producing a superconductor of an immisicible alloy and its oxide.

There exist many alloy systems the constituents of which are not easily mixed together (termed hereinafter the "immisicible alloy"), and in which the formation of an alloy (a mixed state) is difficult especially under gravity. These systems, even though capable of forming uniform alloys under nongravity, do not easily form alloys under gravity due to the difference in specific gravity, wettability between consitituents or the like.

For example, an alloy system of Ba and Cu is a typical immisicible alloy, in which it is difficult to obtain a uniformly-mixed melt even in a molten state. The addition of a rare-earth element (Ln), such as Y, does not change the circumstances (It is to be noted that, in the present invention, Y is also treated as a rare-earth element other than the lanthanides, due to similarity in properties). As a method for alloy formation in a system in which alloy formation is difficult by usual methods, a method of forming an amorphous state by rapid quenching (or rapid cooling) of molten metals is well known. As an example of this method, it has been reported that a $LnBa_2Cu_3O_{7-x}$-system oxide can be produced by forming a ribbon-like sheet of an amorphous alloy by rapid quenching of a melt having a composition of $LnBa_2Cu_3$, and subsequently oxidizing the same (Takeshi Masumoto, Journal of the Japan Institute of Metals, vol. 26, No. 10 (1987), p. 968).

However, this rapid quenching method of a melt is effective only for Eu and Yb, in the Ln series, which are capable of having the divalency, and no successful example has been reported about other Ln elements. Especially, the Y-Ba-Cu system, which is a monotectic alloy, is not capable of forming an alloy by the rapid quenching method of a melt, since the molten alloy of the system is not formed.

SUMMARY OF THE INVENTION

As a system the oxide of which shows superconductivity, other than the Ln-Ba-Cu system, there are immiscible alloy systems (for example, the Bi-(Ca, Sr)-Cu system). Relative to these systems, no successful example has hitherto been reported about producing a superconductor by forming an alloy by a method other than the vapor deposition method, such as sputtering or the like, and subsequently oxidizing the alloy.

Accordingly, there has been a need in the art to develop an effective alloy-formation method for processing these immiscible alloy systems.

The present invention responds to the need described above. In particular it is an object of the present invention to overcome limitations of the conventional alloy-formation methods, such as the rapid quenching method of a melt or the like.

The present invention basically embraces the following aspects of the production methods (1) through (3).

(1) A method for producing a superconductor comprising the steps of subjecting a composite body comprising constituents of an immiscible alloy to electric discharge explosion flame spraying thereby depositing an alloy on a substrate, and oxidizing the resultant alloy.

(2) A method for producing an immiscible alloy comprising the steps of providing a composite body comprising constituents of an immiscible alloy, and subjecting the composite body to electric discharge explosion flame spraying thereby depositing an alloy film on a substrate.

(3) A method for producing an oxide film of an immiscible alloy comprising the steps of subjecting a composite body comparing constituents of an immiscible alloy to electric discharge explosion flame spraying thereby depositing an alloy film on a substrate, and subjecting the resultant alloy film to heat treatment in an oxidizing atmosphere under conditions sufficient to oxidize the alloy.

BRIEF DESCRIPTION OF THE DRAWINGS

FIG. 2. shows X-ray diffraction charts of an embodiment (the lower row) and a comparative example (the upper row).

DESCRIPTION OF THE PREFERRED EMBODIMENTS

Figure 1:
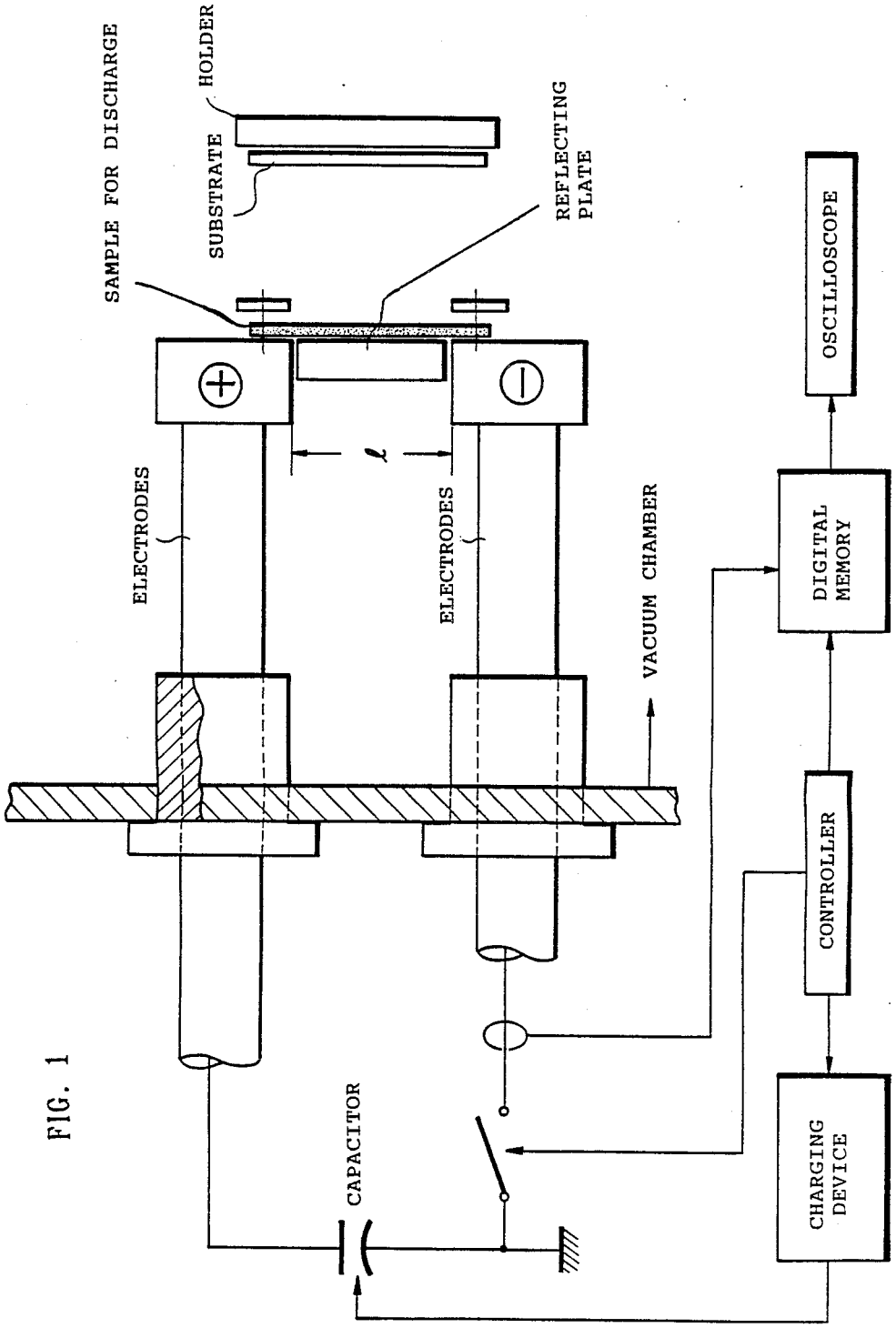
FIG. 1 shows an example of an electric discharge explosion flame spraying apparatus used in the present invention.

As typical examples of the immiscible alloy systems, there are the $LnBa_2Cu_3$ system and $LnBa_2Cu_4$ system (Ln represents at least of the rare-earth elements including Y), and as for the oxides thereof. $LnBa_2Cu_3O_{7-x}$ (x=0–0.5), the one in which Y ie used as Ln is a typical superconductor. Oxides (0=7−x) of the $Ln_2Ba_4Cu_8$ system alloy also show superconductivity. Further, a part of Y in the Y-Ba-Cu system alloy can be replaced by at least one other of the rare-earth elements (Gd, Er, Ho, La, Tb, Dy, Sm, Yb or the like).

The $YBa_2Cu_3$ system alloy is a monotectic alloy, the melt of its consitituent elements does not form an alloy, and it is difficult to obtain an amorphous state by the rapid quenching method. However, by an electric discharge explosion (flame spraying) method, it is possible to form an alloy, and to produce an oxide therefrom by oxidation processing.

As an object to be exploded (a sample for discharge) which is subjected to electric discharge explosion flame spraying a composite body of constiuents of an immiscible alloy is used. As the composite body, it is preferable to use a body of constituent elements of an immiscible alloy. The body can comprise at least one constituent element and an alloy of at least two constituent elements, or a body of at least two alloys each including at least two constituent elements. It is preferable that at least one constituent in the composite body is in the form of a sheet, and it is most preferable that the composite body contains at least two layers of sheet-like constituents. A constituent (which is difficult to form in a sheet) is preferably in the state of being wrapped up within a sheet (in shape of a roll, in the form of sandwiched laminated layers, in the form of a tube or in the form of a capsule or the like), and further preferably in the form of a wire-like (or rod-like, tubular, belt-like) body (termed generically hereinafter the "wire-like body"), taking into consideration mounting to terminals for the electric flame spraying.

Each constituent of the composite body is formed in a wire-body so as to be uniformly distributed, mounted between discharge terminals of an electric discharge explosion flame spraying apparatus, and the interior of the apparatus is maintained under a predetermined atmosphere (usually under a reduced pressure or under vacuum in order to facilitate the generation of electric discharge explosion flame spraying). Electric discharge explosion flame spraying is caused by passing an impulsive large current through the sample for discharge. A molten object (particles, or a part or the entirety of the object may be made in the form of a gas or vapor phase by changing conditions) produced by the electric discharge explosion is collided with and applied on the surface of a substrate (usually a plate, but another shape is also possible) disposed at a predetermined position within the apparatus. Thus, an alloy film having a predetermined composition is formed on the surface of the substrate. Each constituent of an immiscible alloy instantaneously becomes molten at the moment of electric discharge explosion (the temperature reaches no lower than 2000° C.), uniformly mixed by the impact of the electric discharge explosion, applied to the substrate and simultaneously cooled to form an alloy.

Thus, an alloy system, which is immiscible under normal conditions, is easily and instantaneously formed as a film-like alloy. The composition of the sample for electric discharge explosion can be experimentallt determined corresponding to the target composition of the resultant alloy. The film-like alloy is subjected to an oxidation processing, under the condition as being applied on the substrate, or after having been peeled under certain circumstances, to form an oxide film. Oxidation processing can be usually performed by heating the alloy under the presence of oxygen (for example, in air, in oxygen gas or in an oxidizing atmosphere). Heat treatment is performed at a temperature and for a time sufficient enough for the oxide film to show characteristics as a superconductor. For example, for forming a superconductive oxide film of the Y-Ba-Cu-O system, it is possible to choose a temperature range of more than 600° C. and less than 960° C., preferably 800°–900° C. The processing time is determined depending on oxygen concentration and processing temperature, and also depending on the film thickness. Further, this technique can also be applied to the Bi-(Ca, Sr)-Cu system alloy, which is also an immiscible alloy, and it is also possible to produce a superconductor consisting of an oxide of the Bi-(Ca, Sr)$_2$-Cu$_3$-O$_{7-x}$ system. In this case, also, an oxidizing processing sufficient for providing superconductivity is possible by heat treatment at about 800° C. It is also possible to apply this technique to other superconductive materials based on immiscible alloys.

As the substrate, it is preferable to use Cu for the alloy system containing Cu, but it is also possible to use other substrate materials, such as Ag (there is no special limitation for the substrate material). Next, a concrete example of the preparation of wire-like bodies for a sample for discharge will be described. It is preferable that at least one sheet-like member containing constituents be used. The Y-Ba-Cu system will now be taken as an example. A commerical Cu foil (approximately, a few tens to a few hundreds of $\mu$m) is used as a Cu source, a Ba metal block (usually a columnar body) is made into a foil as a Ba source, and a commerical flake-like metallic Y is pulverized into granules or a powder as a Y source. The Y particles are uniformly dispersed on the Cu foil, the Ba foil is laminated thereon, and is wound up in the shape of a roll. A high-density object which is made by densification, e.g., compressing this foil (for example, amde into a long plate) can be used as the wire-like body. A core (a nonconductor) may also be used when the roll is made. As already described before, the wire-like body (the material for electric discharge explosion flame spraying) may be properly modified in accordance with the alloy system as the target and available material sources.

Electric discharge explosion flame spraying is performed under the conditions in which the electric discharge explosion flame spraying can be caused (the distance between terminals, voltage, discharge energy, discharge time, atmospheric gas pressure, the shape of the sample for discharge, weight or the like). The details of these conditions can be experimentally determined. As an example, it is possible to obtain an alloy from a sample having a distance between terminals of a few centimeters by electric discharge explosion flame spraying under the conditions of a charging voltage of a few kV, a discharge energy of no smaller than a few tens of kJ (as a standard, about 10 kJ/g (the sample for discharge)), a current of about no larger than 100 kA, in vacuum (about no higher than 10 Torr).

The distance between the sample for discharge and the substrate is properly selected so that the alloy film is uniformly applied on the surface of the substrate. It is also preferable to dispose a reflecting plate (an insulator) at the side opposite to the substrate relative to the sample for electric discharge explosion flame spraying in order to promote the directional significance of spraying.

The presence of superconductive layers in an oxide film produced as described above is confirmed by X-ray diffraction. For example, in the case of the Y-Ba$_2$-Cu$_3$-O$_{7-x}$ system, the presence of a rhomic phase has been confirmed in an embodiment.

EXAMPLES

EXAMPLE 1

1 g of a metallic Ba block was worked by hammering into a foil of an elliptical shape of 3 cm $\times$ 3.5 cm. 0.32 g of flake-like metallic Y (commerical product) was pulverized into granules having a diameter of no larger than 0.5 mm in average. As a Cu source, a commerical Cu foil (50 $\mu$m thick) which was cut into 60 mm (effective portion: 40 mm) long $\times$ 39 mm was used (density of Cu: 8.93 g/cm$^3$).

The Cu foil was laid down, the Y granules were uniformly spread thereover leaving a 10 mm margins at both ends of the entire length, the Ba foil was then laid thereon, and a laminated roll (60 mm of total length $\times$ 5 mm of diameter) was wound up. This roll was subjected to rubber pressing with a pressure of 80–90 kgf/cm$^2$ to obtain a belt-like object of 60 mm of total length $\times$ 8 mm wide $\times$ 1–1.5 mm thick. 10 mm at each of both ends of 60 mm of the total length was reserved as a terminal portion for mounting a terminal. This belt-like object was mounted between the terminals (the effective spacing =40 mm) of the electric discharge explosion flame spraying apparatus shown in FIG. 1 as the sample for discharge. The pressure within the apparatus was evacuated to form a vacuum (0.1 Torr), a Cu plate as a substrate was disposed so as to be a plane parallel to the sample for electric discharge explosion flame spraying, and a reflected plate (made of an acrylic resin) was disposed behind the belt-like object. Electric discharge explosion flame spraying was caused by 3 kV of charged voltage, 45 kJ of discharge energy, 80–90 kA of current and 160$\mu$-sec of currenet-passing (discharging)

time. The electric charges stored in a capacitor impulsively flow through the sample for discharge mounted between electrodes of opposite polarity (+and −), thereby causing electric discharge explosion flame spraying simultaneously accompanying melting and high-speed spraying of the sample. The sprayed molten particles are influenced by the magnetic field due to the impulsive current and mainly sprayed along the direction of the magnetic field, and deposited on the surface of the substrate. As a result, an alloy film having the maximum thickness of about 0.2 mm was obtained on the Cu substrate (the Cu substrate was maintained at room temperature, but it may also be heated if desired).

The alloy film was subjected to heat treatment in air together with the substrate under the conditions of 800° C. ×2 hrs to form an oxide film. The presence (no less than 50%) of the $YBa_2Cu_3O_7$ rhombic system showing superconductivity was recognized by X-ray diffraction. The electric resistance of this oxide film becomes substantially zero at 88 K. The film shows repulsive floating against the magnetic field of a permanent magnet, and also shows the Meissner effect. FIG. 2 shows the results of the X-ray diffraction. In FIG. 2, the upper row (line) shows the result for a sintered body of $YBa_2Cu_3O_{7-x}$, and the lower row (line) shows the result after heat treatment for a sample obtained by the same manner as in Example 1. The peak indicated by an arrow in the lower row shows a superconductive phase, and several small peaks at the left thereof show nonreacted substance (impurities).

EXAMPLE 2

A sample for discharge, in which the content of Cu was incrased by 30% relative to the stoichiometric (atomic) ratio of $YBa_2Cu_3$, was prepared in the same manner as in Example 1. After electric discharge explosion flame spraying the resultant alloy film was subjected to oxidation processing in air under the conditions of 800° C. ×2 hrs. According to X-ray diffraction of this oxide film of the alloy, a phase showing superconductivity occupies the majority of the film.

EXAMPLE 3

The same Y and Cu as in Example 1 were used, Y and Cu were weighed in 1:2 by atomic fraction, molten and solidified, to prepare a YCu alloy. This was a hard and brittle alloy, and difficult to work into a foil-like or wire-like form. Hence it was pulverized by a vibrating mill so that particles no larger than 0.1 mm diameter were obtained. This YCu alloy in the form of granular powder was uniformly spread over a copper foil of 50 μm thickness, a Ba foil was laid thereupon. The entire laminated structure was wound into the shape of a cylinder, which was then compressed by a press, to obtain samples for discharge. A sample in which the ratio of constituents is Y:Ba:Cu=1:2:4 (by atomic fraction) was subjected to the same electric discharge explosion flame spraying as in Example 1 on a Cu-plate. The resultant alloy film was processed in an oxygen gas at 800° C. for 5 hours. It was found by X-ray diffraction that almost the entirety of the produced object is an oxide showing superconductivity.

As described above, according to the present invention, it is possible to instantaneously form an alloy which has an immiscible property under normal conditions, by electric discharge explosion flame spraying, and easily obtain a superconductor by performing oxidation processing of the alloy. The present invention has a remarkable effect in that an efficient production of a superconductive material based on an immiscible alloy becomes possible.

While the invention has been described with reference to the foregoing embodiments, various changes and modifications may be made thereto which fall within the scope of the appended claims.

What is claimed is:

1. A method for producing a superconductivity comprising:
    subjecting a composite body comprising constituents of an immiscible alloy to electric discharge explosion flame spraying thereby depositing an alloy on a substrate, and
    oxidizing the resultant alloy.

2. A method for producing an immiscible alloy comprising:
    providing a composite body comprising constituents of an immiscible alloy, and
    subjecting the composite body to electric discharge explosion flame spraying thereby depositing an alloy film on a substrate.

3. A method for producing an oxide film of an immiscible alloy comprising:
    subjecting a composite body comprising constituents of an immiscible alloy to discharge explosion thereby depositing an alloy film on a substrate, and
    subjecting the resultant alloy film to heat treatment in an oxidizing atmoisphere.

4. A method according to any one of claims 1 through 3, wherein said immiscible alloy is a Ln-Ba-Cu-system alloy wherein Ln represents at least one of rare-earth elements which include Y, exclusive of those which are miscible.

5. A method according to claim 4, wherein said immiscible alloy is an $Y_1Ba_2Cu_3$-section or an $Y_2Ba_4Cu_8$-system alloy.

6. A method according to claim 5, wherein a part of Y, which is a constituent of said immiscible alloy, is replaced by at least one rare-earth element selected from the group of Gd, Er, Ho, La, Tb, Dy, Sm and Yb.

7. A method according to any one of claims 1 through 3, wherein said composite body is selected from the group consisting of following (a), (b) and (c):
    (a) a composite body comprising constituent elements of said immiscible alloy,
    (b) a composite body comprising at least one constituent element of said immiscible alloy and an alloy of at least two constituent elements of said immiscible alloy,
    (c) a composite body comprising at least two kinds of alloys, each of which includes at least two constituent elements of said immiscible alloy.

8. A method according to any one of claims 1 through 3, wherein said composite body is a roll-like body, wire-like body, a tubular body or a sheet-like body containing at least one sheet-like constituent of said immiscible alloy.

9. A method according to claim 8, wherein said composite body contains at least two layers of sheet-like constituents of said immiscible alloy.

10. A method according to any of claims 1 through 3, wherein Cu is used as said substrate.

11. A method according to any one of claims 1 through 3, wherein the electric discharge explosion flame spraying is conducted in an atmosphere of a reduced pressure.

12. A method according to any one of claims 1 through 3, wherein the composite body is densified before the electric discharge explosion flame spraying.

13. A method according to any one of claims 1 through 3, wherein the composite body includes a core of a nonconductor.

14. A method according to any one of claims 1 through 3, wherein the composite body includes a foil of Cu, a foil of Ba and a powder of Y.

15. A method according to any one of claims 1 through 3, wherein a reflecting plate is disposed at a side of the composite body opposite to a side of the composite body facing the substrate.

16. A method according to any one of claims 1 through 3, wherein the substrate is positioned so as to lie in a plane parallel to the composite body.

17. A method according to any one of claims 1 through 3, wherein the composite body is mounted between electrodes of opposite polarity and the electric discharge explosion flame spraying simultaneously melts the composite body and causes high-speed spraying of the melted composite body onto the substrate.

18. A method according to any one of claims 1 through 3, wherein the electric discharge explosion flame spraying is performed by passing an electric current through the composite body causing the composite body to form molten particles which are sprayed towards the substrate in a direction of a magnetic field due to the electric current.

19. A method according to any one of claims 1 through 3, wherein the immiscible alloy comprises a monotectic alloy.

* * * * *